(12) United States Patent
Linkewitsch

(10) Patent No.: US 8,132,087 B2
(45) Date of Patent: Mar. 6, 2012

(54) FORWARD ERROR CORRECTION MAPPING AND DE-MAPPING TECHNIQUES

(75) Inventor: Niklas Linkewitsch, Evessen (DE)

(73) Assignee: Intel Corporation, Santa Clara, CA (US)

( * ) Notice: Subject to any disclaimer, the term of this patent is extended or adjusted under 35 U.S.C. 154(b) by 465 days.

(21) Appl. No.: 12/193,187

(22) Filed: Aug. 18, 2008

(65) Prior Publication Data

US 2008/0301535 A1 Dec. 4, 2008

Related U.S. Application Data

(62) Division of application No. 10/660,404, filed on Sep. 10, 2003, now Pat. No. 7,415,658.

(51) Int. Cl.
*G06F 11/00* (2006.01)
*H03M 13/00* (2006.01)

(52) U.S. Cl. ......................... 714/801; 714/758

(58) Field of Classification Search ................. 714/801, 714/758
See application file for complete search history.

(56) References Cited

U.S. PATENT DOCUMENTS

| | | | |
|---|---|---|---|
| 4,329,708 A | 5/1982 | Yamamoto et al. | |
| 4,564,945 A | 1/1986 | Glover et al. | |
| 5,077,721 A * | 12/1991 | Sako et al. | 369/59.26 |
| 5,230,003 A | 7/1993 | Dent et al. | |
| 5,392,299 A | 2/1995 | Rhines et al. | |
| 5,754,563 A | 5/1998 | White | |
| 5,812,601 A | 9/1998 | Schramm | |
| 5,970,085 A * | 10/1999 | Yi | 370/342 |
| 5,978,365 A * | 11/1999 | Yi | 370/331 |
| 6,029,264 A | 2/2000 | Kobayashi et al. | |
| 6,094,427 A * | 7/2000 | Yi | 370/331 |
| 6,158,038 A | 12/2000 | Yamawaki et al. | |
| 6,161,209 A | 12/2000 | Moher | |
| 6,189,123 B1 | 2/2001 | Anders Nystrom et al. | |
| 6,198,413 B1 * | 3/2001 | Widmer | 341/59 |
| 6,304,996 B1 * | 10/2001 | Van Stralen et al. | 714/796 |
| 6,389,572 B1 * | 5/2002 | Garrabrant et al. | 714/780 |
| 6,421,804 B1 | 7/2002 | Lee | |
| 6,581,178 B1 | 6/2003 | Kondo | |
| 6,622,277 B1 | 9/2003 | Ramanujam et al. | |
| 7,415,658 B2 | 8/2008 | Linkewitsch | |
| 2002/0161972 A1 | 10/2002 | Talagala et al. | |
| 2003/0135514 A1 | 7/2003 | Patel et al. | |
| 2003/0188248 A1 | 10/2003 | Kauschke et al. | |
| 2003/0188253 A1 | 10/2003 | Kauschke et al. | |
| 2004/0177153 A1 * | 9/2004 | Pelley | 709/236 |
| 2004/0240485 A1 * | 12/2004 | Lipski et al. | 370/537 |

FOREIGN PATENT DOCUMENTS

| | | |
|---|---|---|
| EP | 0663776 A2 | 7/1995 |
| EP | 0674395 A2 | 9/1995 |
| EP | 0709979 A2 | 5/1996 |
| EP | 1030456 A2 | 8/2000 |

(Continued)

OTHER PUBLICATIONS

PCT Written Opinion, dated Mar. 23, 2005, International Application No. PCT/US03/09621, 6 pages.

(Continued)

*Primary Examiner* — M. Mujtaba K Chaudry
(74) *Attorney, Agent, or Firm* — Glen B. Choi

(57) ABSTRACT

Briefly, techniques to provide varying levels of enhanced forward error correction without modifying a line rate of a frame.

17 Claims, 7 Drawing Sheets

FOREIGN PATENT DOCUMENTS

| EP | 1052872 A2 | 11/2000 |
|---|---|---|
| EP | 1162775 A2 | 12/2001 |
| WO | 0195503 A1 | 12/2001 |
| WO | 03/085842 A2 | 10/2003 |
| WO | 2005/036807 A2 | 4/2005 |
| WO | 2005/036807 A3 | 8/2005 |

OTHER PUBLICATIONS

Pyndiah, R. et al., "Near Optimum Decoding of Product Codes", IN Proceedings of IEEE GLOBECOM '94, vol. 1/3, Nov.-Dec. 1994, pp. 339-343.

Wicker, Stephen B., "Error Control Systems for Digital Communication and Storage", Prentice-Hall, 1995, pp. 116-121.

Stojanovic, N. et al., "Concatenated Three-Dimensional SPC Turbo Code for Optical Transmission Systems", 5th International Conference on Telecommunications in Modern Satellite, Cable and Broadcasting Service, 2001, vol. 2, Sep. 19-21.

Agere Systems, "TFEC0410G 40 Gbits/s Optical Networking Interface With Strong FEC and Digital Wrapper", Mar. 2001, 18 pages.

Keshav, S. "An Engineering Approach to Computer Networking ATM Networks, the Internet, and the Telephone Network", Chapter 12: Error Control, Apr. 1997, Addison-Wesley Professional Computing Series, pp. 390-391.

O. Ait Sab, et al., "Block Turbo Code Performances for Long-Haul DWDM Optical Transmission Systems", IEEE vol. 3 of 4, XP002181576, pp. 280-282, Mar. 2000.

O. Ait Sab., et al., "Concatenated Forward Error Correction Schemes for Long-Haul DWDM Optical Transmission Systems", ECOC '99, Paris, France, vol. II of II, XP001035445., pp. 290-291, Sep. 1999.

Mizuochi, et al., "Transparent Multiplexer Featuring Super FEC for Optical Transport Networking", Mitsubishi Electric Corp., Japan, 4 pages, 2001.

Argon, et al., "Turbo Product Codes for Performance Improvement of Optical CDMA Systems", Georgia Institute of Technology, Atlanta, GA USA 2001, 5 pages.

Young, Kim et al., "An Optical CDMA Packet Network with Turbo Coding", Central Research & Development Center, Korea 2000, 5 pages.

PCC, et al., "Concatenated FEC Experiment over 5000 KM Long Straight Line WDM Test Bed", Tyco Submarine Systems Laboratories, Holmdel, NJ, USA, XP-000967046, 4 pages, Feb. 1999.

Kao, et al., "A Product-Coded WDM Coding System", Transactions on Communications, New York, USA, Jan. 1996, 4 pages.

Ait, Sab "FEC Techniques in Submarine Transmission Systems", Optical Society of America, 1999, 3 pages.

Berrous, Claude "Near Optimum Error Correcting Coding and Decoding: Turbo-Codes", IEEE Transactions on Communications, vol. 44, No. 10, Oct. 1996, pp. 1261-1271.

International Telecommunication Union, Telecommunication Standardization Sector (ITU-T), "Series G: Transmission Systems and Media, Digital Systems and Networks; Digital Terminal Equipments—General; Interface for the Optical Transport Network (OTN)", Document No. G.709 (revised), Oct. 2001, 133 pages.

European Patent Office, International Search Report and Written Opinion for International Application No. PCT/US2004/027681, (Jun. 16, 2005),12 pages.

"Forward error correction for high bit-rate DWDM submarine systems", Series G: Transmission Systems and Media, Digital Systems and Networks, Digital sections and digital line system—Optical fibre submarine cable systems, International Telecommunication Union, Telecommunication Standardization Sector, ITU-T Recommendation G.975.1, Feb. 2004, Appendix I.7, pp. 28-41.

International Preliminary Report on Patentability for PCT Patent Application No. PCT/US2004/027681, mailed on Mar. 23, 2006, 8 pages.

Examination Report Received for United Kingdom Patent Application No. 200606296.2, reported on Aug. 25, 2006, 1 page.

Office Action Received for German Application No. 11 2004 001 600.2, mailed on Jan. 14, 2009, 3 pages of German Office Action and 2 pages of English Translation.

Office Action Received for German Application No. 11 2004 003 070.6, mailed on Jun. 16, 2010, 5 pages of German Office Action and 5 pages of English Translation.

Office Action received for Chinese Patent Application No. 200480025868.1, mailed on Nov. 7, 2008, 10 pages of Chinese Office Action including 6 pages of English Translation.

Office Action received for Chinese Patent Application No. 201010122521.6, mailed on Jul. 7, 2011, 13 pages of Chinese Office Action including 9 pages of English Translation.

* cited by examiner

FORWARD ERROR CORRECTION MAPPING AND DE-MAPPING TECHNIQUES

CROSS REFERENCE TO RELATED PATENT APPLICATION

This application relates to and is a divisional of U.S. Utility patent application Ser. No. 10/660,404 entitled "FORWARD ERROR CORRECTION MAPPING AND DE-MAPPING TECHNIQUES", filed Sep. 10, 2003, issued as U.S. Pat. No. 7,415,658 on Aug. 19, 2008, which is hereby incorporated herein by reference for all purposes.

FIELD

The subject matter disclosed herein generally relates to forward error correction mapping techniques.

DESCRIPTION OF RELATED ART

ITU-T G.709/Y.1331 Interfaces for the Optical Transport Network (OTN) (February 2001) describes a convention for conversion of signals between the optical transport network (OTN) standard and either Synchronous Optical Network (SONET) or Synchronous Digital Hierarchy (SDH) standards. G.709 describes forward error correction (FEC) as a manner of controlling errors in transmitted data. FEC information is transmitted with data and can be used by the receiver to check and correct the data. G.709 describes Reed-Solomon coder/decoder techniques for determining and mapping FEC information into designated locations within an OTN frame as well as techniques for processing and de-mapping FEC information.

BRIEF DESCRIPTION OF THE DRAWINGS

The subject matter regarded as the invention is particularly pointed out and distinctly claimed in the concluding portion of the specification. The invention, however, both as to organization and method of operation may best be understood by reference to the following detailed description when read with the accompanying drawings in which:

Note that use of the same reference numbers in different figures indicates the same or like elements.

DETAILED DESCRIPTION

Figure 1A:
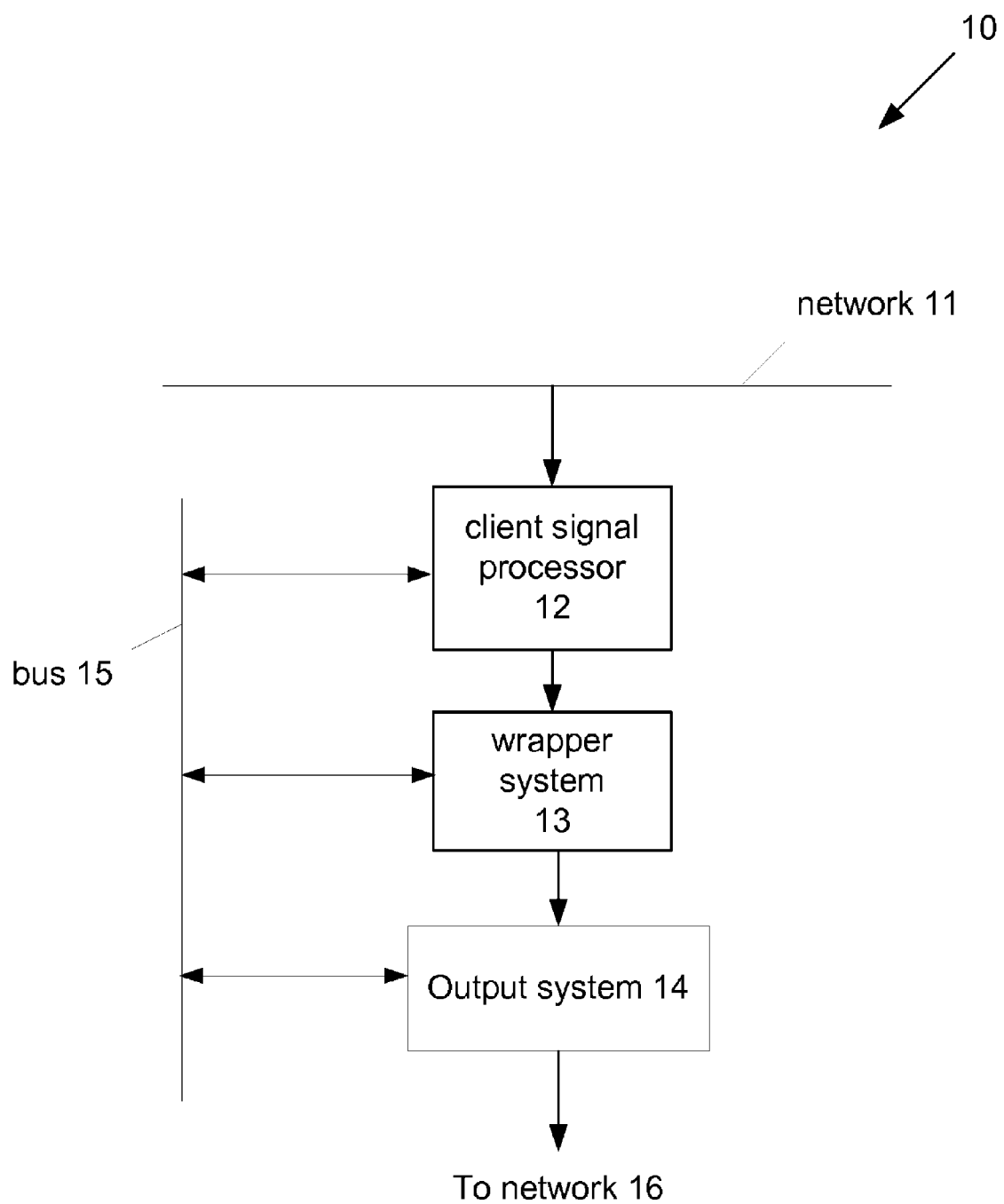
FIG. 1A depicts an implementation of a transmitter system that can use embodiments of the present invention.

FIG. 1A depicts an implementation of a transmitter system 10 that can use embodiments of the present invention. System 10 may include a network 11, client signal processor 12, wrapper system 13, output system 14, and bus 15.

Network 11 may provide intercommunication between processor 12 and other devices such as a packet processor (not depicted), and/or a switch fabric (not depicted). Network 11 may comply with one or more of the following standards: Ten Gigabit Attachment Unit Interface (XAUI) (described in IEEE 802.3, IEEE 802.3ae, and related standards), (Serial Peripheral Interface (SPI), I²C, universal serial bus (USB), IEEE 1394, Gigabit Media Independent Interface (GMII) (described in IEEE 802.3, IEEE 802.3ae, and related standards), Peripheral Component Interconnect (PCI), ten bit interface (TBI), and/or a vendor specific multi-source agreement (MSA) protocol. Bus 15 may provide intercommunication between client signal processor 12, and/or wrapper system 13, and/or output system 14 and other devices such as memory device (not depicted), or microprocessor (not depicted).

Processor 12 may perform media access control (MAC) encoding in compliance for example with Ethernet (as described for example in IEEE 802.3 and related standards). Wrapper system 13 may perform framing and wrapping in compliance for example with ITU-T G.709; and/or forward error correction (FEC) encoding in compliance for example with ITU-T G.975. Wrapper system 13 may use some embodiments of the present invention. Output system 14 may remove jitter from signals provided by wrapper system 13 and prepare signals for transmission to a network 16, which may be optical or electrical format. For example, network 16 may comply with OTN.

In one implementation, components of transmitter system 10 may be implemented among the same integrated circuit. In another implementation, components of transmitter system 10 may be implemented among several integrated circuits that intercommunicate using, for example, a bus or conductive leads of a printed circuit board.

Figure 1B:
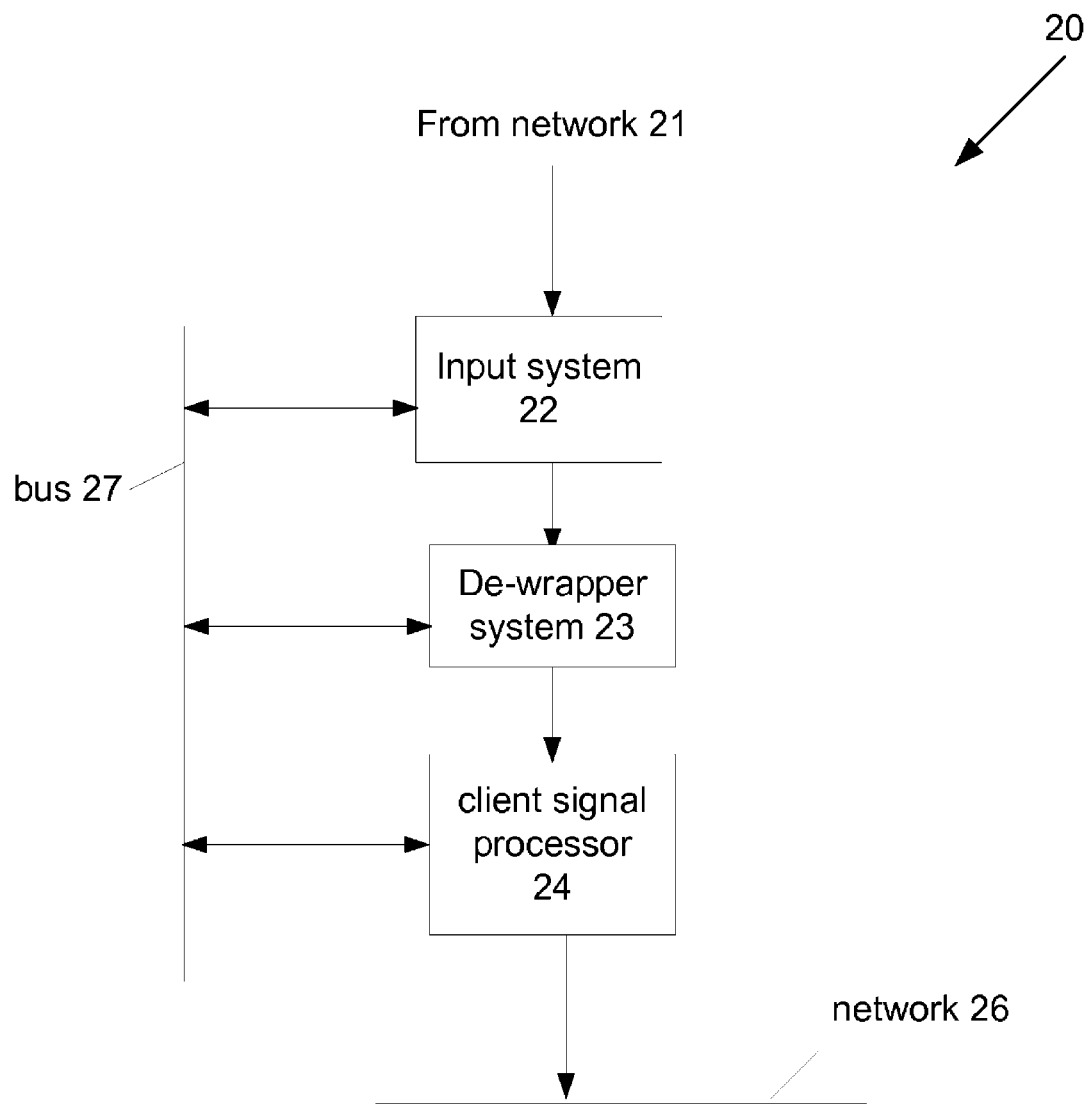
FIG. 1B depicts an implementation of a receiver system that can use embodiments of the present invention.
Figure 2A:
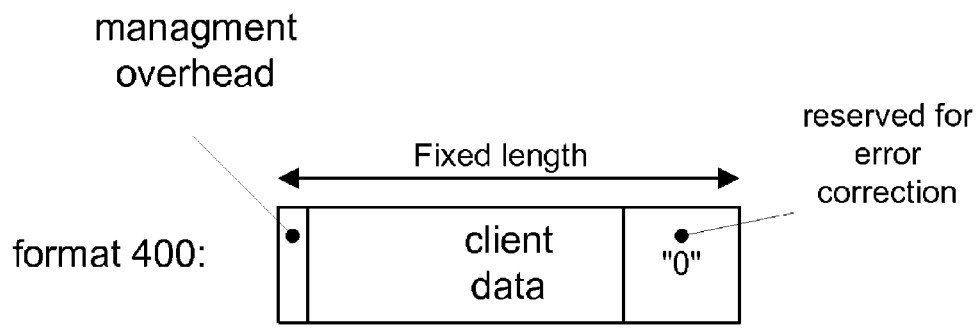
FIGS. 2A to 2E depict frames of varying formats in accordance with an embodiment of the present invention.
Figure 2B:
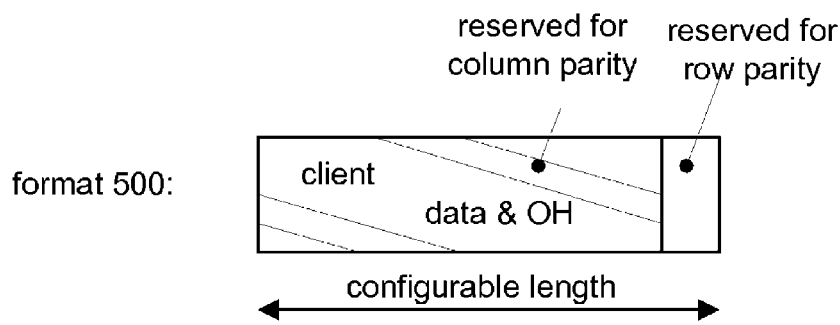
Figure 2C:
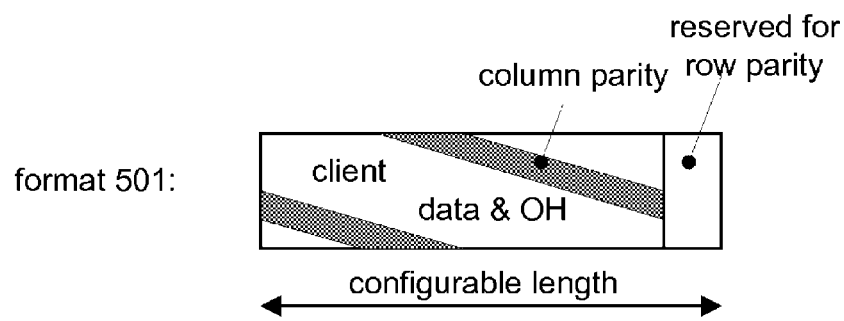
Figure 2D:
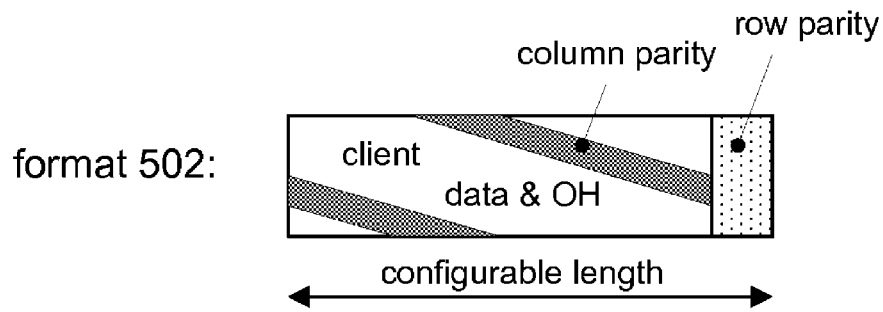
Figure 2E:
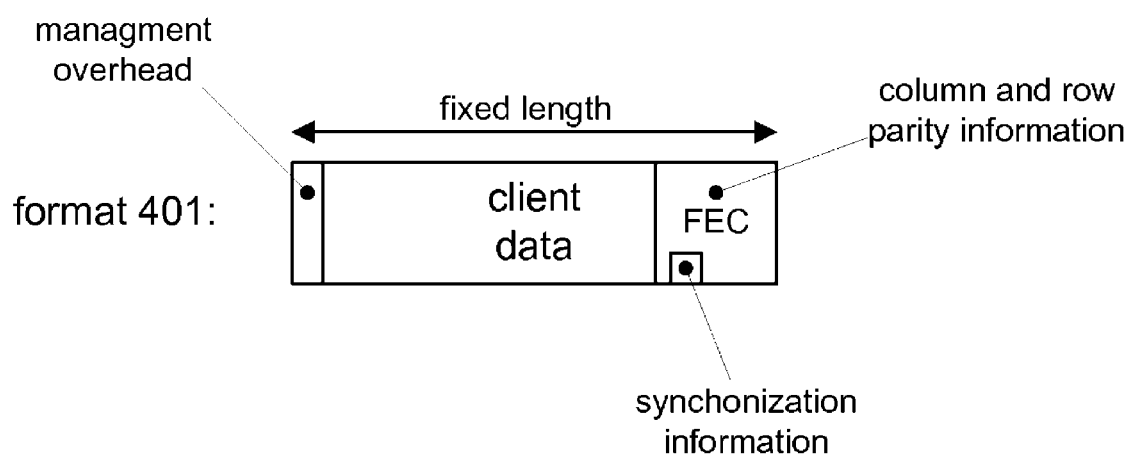

FIG. 1B depicts an implementation of a receiver system 20 that can use embodiments of the present invention. System 20 may include an input system 22, de-wrapper system 23, client signal processor 24, network 26, and bus 27. Input system 22 may receive a signal from a network 21 and prepare the signal for processing by receiver system 20. For example, input system 22 may convert an optical signal to electrical format and/or remove jitter from a signal from the network. De-wrapper system 23 may perform optical transport network (OTN) de-framing and de-wrapping in compliance for example with ITU-T G.709; and/or forward error correction (FEC) processing in compliance for example with ITU-T G.975. De-wrapper system 23 may use some embodiments of the present invention. Processor 24 may perform media access control (MAC) processing in compliance for example with Ethernet.

Network 26 may provide intercommunication between processor 24 and other devices such as a packet processor (not depicted), a switch fabric (not depicted), and/or an optical network (not depicted). Network 26 may utilize similar communications techniques as those of network 11. Bus 27 may provide intercommunication between input system 22 and/or de-wrapper 23 and/or processor 24 and other devices such as a memory device (not depicted) or microprocessor (not depicted).

In one implementation, components of receiver system 20 may be implemented among the same integrated circuit. In another implementation, components of receiver system 20 may be implemented among several integrated circuits that intercommunicate using, for example, a bus or conductive leads of a printed circuit board.

FIGS. 2A to 2E depict frames of respective formats 400, 500, 501, 502, and 401. Frame format 400 may comply with the G.709 OTU2 frame format, although other formats may be used. Frame format 400 may include management overhead, client data, and error correction portions. Frame format 400 may have fixed length and a fixed number of rows. In one example, the client data portion may include data in accordance with the SONET or OTN standards.

Frame format 500 may include a first portion that includes a mixture of client data (from frame format 400), G.709 overhead information (from frame format 400), and reserved space for column parity information as well as a second portion reserved for row parity information. The reserved space for column parity information may be diagonally provided within the first portion. Frame format 500 may be configurable in the following parameters: number of columns, number of rows, the angle and thickness of the column parity information provided within the first portion, and size of row parity information. The parameters may be set to maintain the percentage of bits reserved for client data (from frame format 400) and G.709 overhead information (from frame format 400) among frame format 400 as the same percentage as that in frame format 500.

Figure 4A:
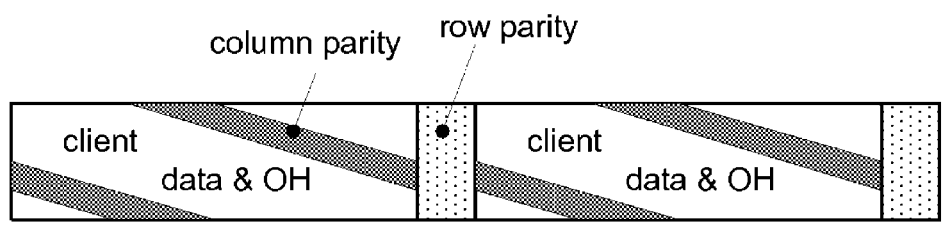
FIGS. 4A and 4B depict example frame streamings.
Figure 4B:
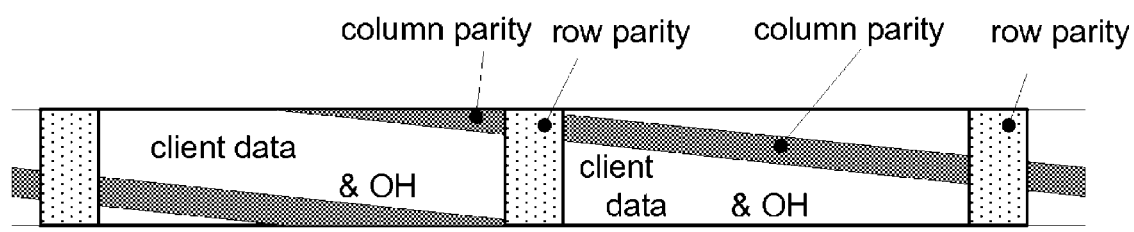

In one implementation, depicted in FIG. 4A, frames of format 500 might stream in a concatenation style as continuous series of separate frames. In this concatenation style, there might be no time gap between two successive frames of format 500. Format 500 may also be processed using an interleaving style such as one described in U.S. patent application Ser. No. 10/113,190, filed Apr. 1, 2002, inventors Poppinga and Kauschke. As depicted in FIG. 4B, the interleaving style may include streaming frames of format 500 as a continuous series of separate frames except column parity information of a single frame of format 500 is spread over multiple frames of format 500. Herein, references to "format 500" or "frame format 500" may refer to streaming in either the concatenation or interleaving styles.

Frame format 501 may be a similar structure as frame format 500 but with column parity information inserted in the reserved space for column parity information. Frame format 502 may be a similar structure as frame format 501 but with row parity information inserted in the reserved space for row parity information. Similar to format 500, formats 501 and 502 may stream by concatenation or interleaving styles.

Frame format 401 may be similar to frame format 400 except at least that the error correction portion may include column and row parity information and synchronization information. For example, column and row parity information may be stored in a similar order as that stored in a frame of format 502. Synchronization information may indicate locations of column and row parity information within frame format 502. Synchronization information may be stored within a predefined location within the error correction portion of frame format 401. In one implementation, synchronization information could be defined in each frame of format 401, but could also appear in every N frames of format 401, where N is an integer greater than one. Alternatively, the synchronization information may be partitioned in a way that every frame one fraction of the synchronization information will be transmitted so that it may take an integer N number of frames of format 401 (where N is greater than one) to transmit the entire synchronization information of a single frame of format 401. Management overhead and client data may be mapped into locations in frame 401 that are similar to those locations in frame 400.

Figure 3:
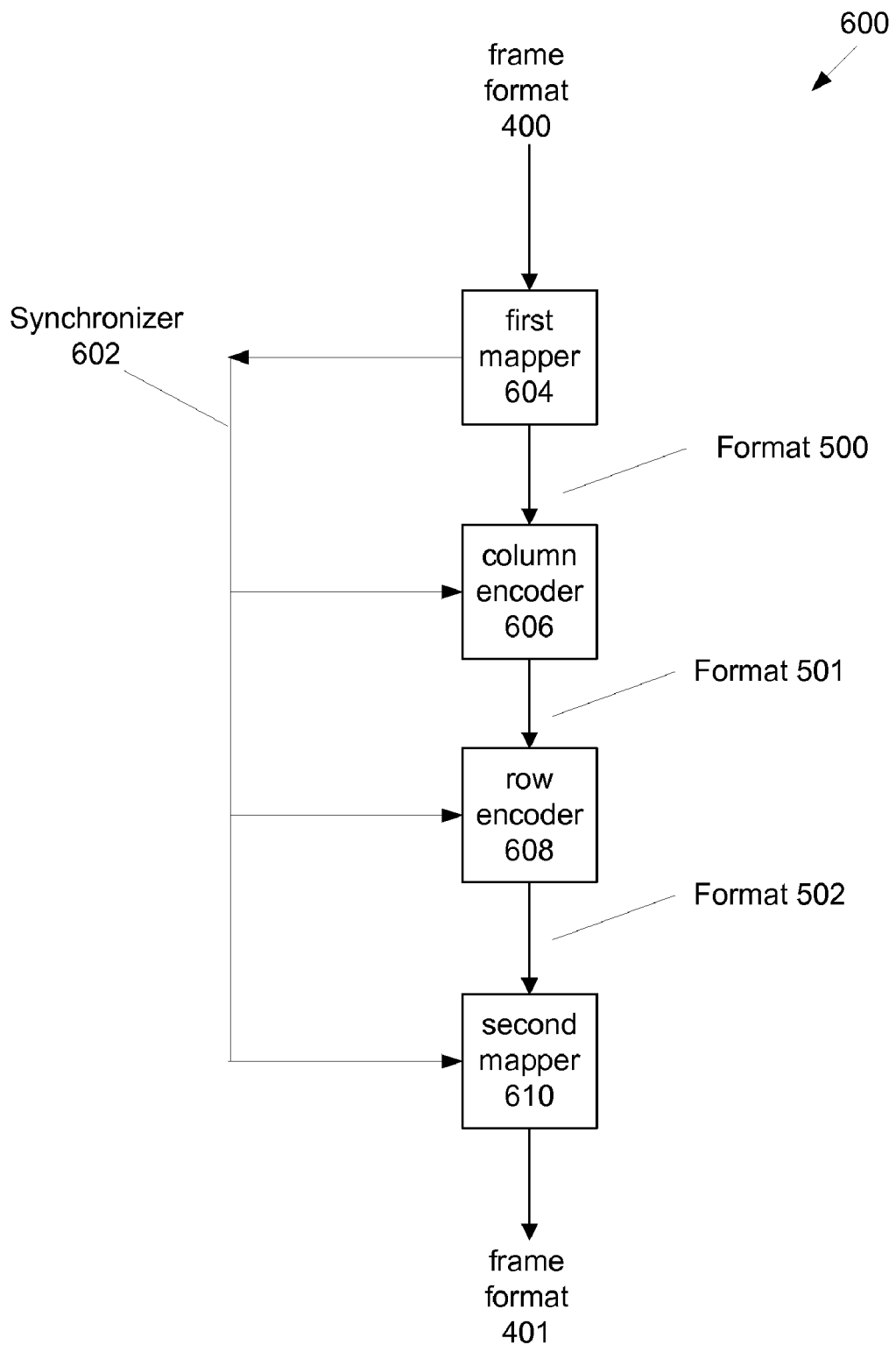
FIG. 3 depicts an encoder, in accordance with an embodiment of the present invention.

FIG. 3 depicts an embodiment of the present invention in an encoder 600, in accordance with an embodiment of the present invention. One implementation of encoder 600 may include synchronizer 602, first mapper 604, column encoder 606, row encoder 608, and second mapper 610. Reference is made to frames having formats 400, 500, 501, 502, and 401 depicted in respective FIGS. 2A to 2E.

Encoder 600 may be implemented as any or a combination of: hardwired logic, software stored by a memory device and executed by a microprocessor, firmware, an application specific integrated circuit (ASIC), and/or a field programmable gate array (FPGA).

Synchronizer 602 may track the bit locations of column and row parity information within a frame of format 500. Synchronizer 602 may provide the bit locations of column and row parity information to column encoder 606, row encoder 608, and second mapper 610. Synchronizer 602 may store synchronization information within a frame of format 401. The synchronization information may represent the timing and phase locations of column and row parity information within a frame of format 500.

First mapper 604 may convert a frame from format 400 to format 500. First mapper 604 may reserve space for column parity information as well as space for row parity information. In the locations inside format 500 depicted as "client data & OH", first mapper 604 may insert client data and management overhead. First mapper 604 may initialize the bits reserved for column and row parity information to zeros. In one implementation, encoder 600 may vary parameters of a frame of format 500 based on the desired level of FEC protection.

Column encoder 606 may insert column parity information into space reserved for column parity information in a frame of format 500. Row encoder 608 may insert row parity information into space reserved for row parity information in a frame of format 500. For example, Bose, Chaudhuri and Hocquenghem (BCH) or Reed Solomon (RS) encoding techniques may be used to determine column and row parity information stored in frame format 500. Calculation of column and row parity information may be based on processing client data. Calculation of column and row parity information may also be based on parameters such as overhead values and parameters of frame format 502 that include, but are not limited to, a number of columns, number of rows, the angle and thickness of the column parity information, and size of row parity information.

Second mapper 610 may convert a frame from format 502 to format 401. Second mapper 610 may map the client data and management overhead into locations inside the frame of format 401 that are similar to those of format 400 and may map column and row parity information as well as synchronization information into the error correction portion of a frame of format 401. A frame of format 401 may be transmitted to a network such as an optical network or electrical network.

Encoder 600 may provide stronger FEC encoding protection than that specified in G.709. Accordingly, by use of encoder 600, signals can be transmitted over systems that introduce higher bit errors. Encoder 600 may provide stronger FEC protection than that specified in G.709 without changing a line rate of management overhead and client data or the transmitted frame structure.

Figure 5:
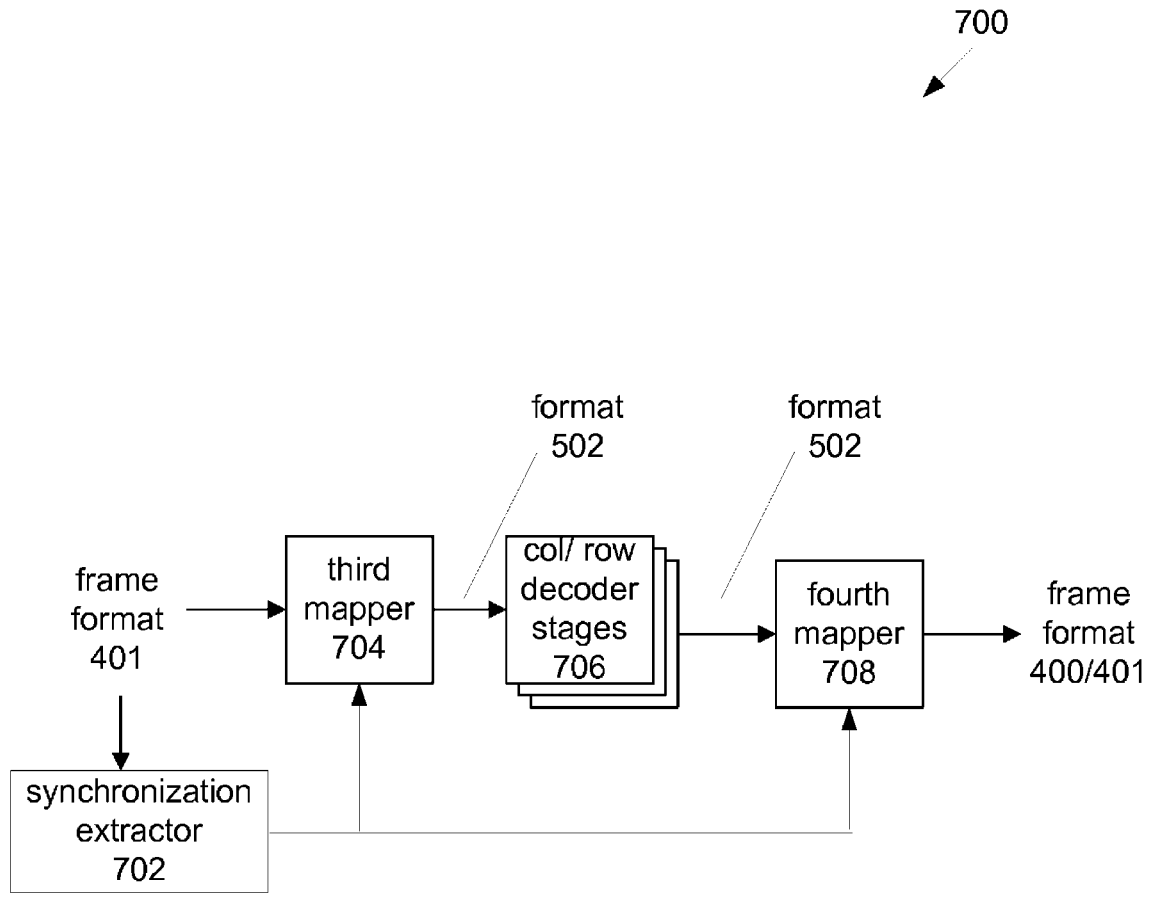
FIG. 5 depicts an embodiment of a decoder, in accordance with an embodiment of the present invention.

FIG. 5 depicts an embodiment of the present invention in decoder 700, in accordance with an embodiment of the present invention. One implementation of decoder 700 may include synchronization information extractor 702, third mapper 704, column and row decoder stages 706, and fourth mapper 708. Reference is made to frames having formats 400, 500, 501, 502, and 401 depicted in respective FIGS. 2A to 2E. For example, decoder 700 may process a frame of format 401 transmitted through a network and from a transmitter using an encoder similar to encoder 600.

Decoder 700 may be implemented as any or a combination of: hardwired logic, software stored by a memory device and executed by a microprocessor, firmware, an application specific integrated circuit (ASIC), and/or a field programmable gate array (FPGA).

Synchronization information extractor 702 may extract synchronization information from a frame of format 401. Synchronization information extractor 702 may provide the locations of column and row parity information in a frame of format 502.

Third mapper 704 may convert a frame from format 401 to format 502. For example, third mapper 704 may read the column and row parity information that is stored in an error correction portion of a frame of format 401. For example, third mapper 704 may store the column and row parity information in locations in a frame of format 502 indicated by the synchronization information.

Column and row decoder stages 706 may decode column and row bit information stored in a frame of format 502. For example in one implementation, column and row decoder stages 706 may utilize BCH or RS techniques to process the column and row bit information and determine whether such processed column and row bit information are correct. Based on the processed column and row bit information, column and row decoder stages 706 may perform error detection and/or correction of management overhead, client data and parity information. Column and row decoder stages 706 may also calculate error statistics in the frames of format 500. For example, error statistics may relate to the percentage of the bandwidth utilized by a frame of format 500. For example, error statistics may relate to management overhead and client data.

In one implementation, column and row decoder stages 706 may perform iterative decoding by alternating processing of rows and columns and performing at least two row or column processings. For example, column and row decoder stages 706 may alternate processing of all rows of a frame of format 502, all columns of a frame of format 502, and (again) all rows of a frame of format 502 or processing of all columns, all rows, and (again) all columns. In one implementation, column and row decoder stages 706 may perform bit processing in the following manner: all rows of a frame of format 502, all columns of a frame of format 502, (again) all rows, (again) all columns, and (again) all rows. In one implementation, column and row decoder stages 706 may perform concatenated decoding by bit processing all rows and all columns once each.

Fourth mapper 708 may convert a frame from format 502 to format 400 or format 401. Fourth mapper 708 may map the client data and management overhead into its original locations inside the frame of format 400 or 401. Fourth mapper 708 may use techniques similar to those described with respect to second mapper 610 to convert a frame of format 502 to format 401.

MODIFICATIONS

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

The invention claimed is:

1. A computer-implemented method comprising:
   receiving an overhead portion and a data portion;
   forming a streaming frame structure including first and second frames, wherein
   the streaming frame structure includes column and row parity information, the overhead portion, and the data portion,
   the column parity information is located in a diagonal stripe within the first and second frames, and
   the stripe is spread over the first and second frames of the streaming frame structure.

2. The method of claim 1, further comprising:
   receiving a source frame, wherein
   the source frame includes the overhead portion and the data portion,
   forming the streaming frame structure includes forming the streaming frame structure with the overhead portion and the data portion from the source frame,
   a percentage of the overhead portion within the streaming frame structure is equal to a percentage of the overhead portion within the source frame, and
   a percentage of the data portion within the streaming frame structure is equal to a percentage of the data portion within the source frame.

3. The method of claim 1, wherein the forming the streaming frame structure comprises:
   inserting column parity information at an angle and thickness within the streaming frame structure and
   inserting row parity information within the streaming frame structure.

4. The method of claim 1, wherein the forming the streaming frame structure comprises performing one of Bose, Chaudhuri and Hocquenghem or Reed Solomon encoding to provide the column and row parity information.

5. The method of claim 1, wherein the streaming frame structure comprises a configurable length and width and wherein the configurable length and width are based on a level of forward error correction encoding.

6. The method of claim 1, wherein the column and row parity information locations within the streaming frame structure are programmable.

7. The method of claim 2, further comprising:
   determining synchronization information that represents locations of column and row parity information within the streaming frame structure;
   forming a third frame based on contents of the streaming frame structure, wherein the third frame comprises an error correction portion;
   storing the synchronization information within the error correction portion; and
   providing the third frame for transmission over a network.

8. The method of claim 7, wherein the third frame has the same dimensions as that of the source frame.

9. An apparatus comprising:
   a processor configured to:
      receive an overhead portion and a data portion and
      form a streaming frame structure including first and second frames,
   wherein
      the streaming frame structure includes column and row parity information, the overhead portion, and the data portion,
      the column parity information is located in a diagonal stripe within the first and second frames, and
      the stripe is spread over the first and second frames of the streaming frame structure.

10. The apparatus of claim 9, wherein the processor is to receive a source frame and wherein
   the source frame includes the overhead portion and the data portion, to form the streaming frame structure, the processor is to form the streaming frame structure with the overhead portion and the data portion from the source frame, a percentage of the overhead portion within the streaming frame structure is equal to a percentage of the overhead portion within the source frame, and a percentage of the data portion within the streaming frame structure is equal to a percentage of the data portion within the source frame.

11. The apparatus of claim 9, wherein to form a streaming frame structure, the processor is to:

insert column parity information at an angle and thickness within the streaming frame structure and insert row parity information within the streaming frame structure.

12. The apparatus of claim 9, wherein to form the streaming frame structure, the processor is to perform one of Bose, Chaudhuri and Hocquenghem or Reed Solomon encoding to provide the column and row parity information.

13. The apparatus of claim 9, wherein the streaming frame structure comprises a configurable length and width and wherein the configurable length and width are based on a level of forward error correction encoding.

14. The apparatus of claim 9, wherein the column and row parity information locations within the streaming frame structure are programmable.

15. The apparatus of claim 10, wherein the processor is also to:

determine synchronization information that represents locations of column and row parity information within the streaming frame structure;

form a third frame based on contents of the streaming frame structure, wherein the third frame comprises an error correction portion;

store the synchronization information within the error correction portion; and provide the third frame for transmission over a network.

16. The apparatus of claim 15, wherein the third frame has the same dimensions as that of the source frame.

17. The apparatus of claim 9, further comprising:

a network interface communicatively coupled to the processor, the medium capable to communicatively couple the processor to a network.

* * * * *